(12) United States Patent
Ye

(10) Patent No.: US 11,327,622 B2
(45) Date of Patent: May 10, 2022

(54) FLEXIBLE DISPLAY AND MANUFACTURING METHOD FOR THE SAME

(71) Applicant: Wuhan China Star Optoelectronics Semiconductor Display Technology Co., Ltd., Hubei (CN)

(72) Inventor: Jian Ye, Guangdong (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 768 days.

(21) Appl. No.: 16/084,209

(22) PCT Filed: Jun. 15, 2018

(86) PCT No.: PCT/CN2018/091512
§ 371 (c)(1),
(2) Date: Sep. 11, 2018

(87) PCT Pub. No.: WO2019/192075
PCT Pub. Date: Oct. 10, 2019

(65) Prior Publication Data
US 2021/0208711 A1 Jul. 8, 2021

(30) Foreign Application Priority Data
Apr. 4, 2018 (CN) .......................... 201810299892.8

(51) Int. Cl.
*G06F 3/045* (2006.01)
*H01L 27/32* (2006.01)
(Continued)

(52) U.S. Cl.
CPC ............ *G06F 3/045* (2013.01); *H01L 27/323* (2013.01); *H01L 51/0097* (2013.01);
(Continued)

(58) Field of Classification Search
CPC .......... G06F 3/045; G06F 2203/04102; G06F 2203/04103; G06F 2203/04107;
(Continued)

(56) References Cited

U.S. PATENT DOCUMENTS

2017/0147117 A1 5/2017 Song
2017/0364187 A1* 12/2017 Zhai .................... G02F 1/13338
2018/0321793 A1* 11/2018 Kim ..................... G06F 3/04182

FOREIGN PATENT DOCUMENTS

CN 102955639 A 3/2013
CN 202995695 U 6/2013
(Continued)

OTHER PUBLICATIONS

English Translation of CN 104199580 (Year: 2014).*
International search report dated Jan. 9, 2019 from corresponding application No. PCT/CN2018/091512.

*Primary Examiner* — Patrick N Edouard
*Assistant Examiner* — Eboni N Giles
(74) *Attorney, Agent, or Firm* — PV IP PC; Wei Te Chung; Ude Lu

(57) ABSTRACT

A flexible display and manufacturing method for the same are disclosed. The flexible display includes a flexible display panel, a conductive layer, an insulation layer, and a touch electrode layer. Wherein the flexible display panel includes multiple sub-pixels, the touch electrode layer includes multiple touch sensing electrodes and multiple touch driving electrodes, the touch sensing electrodes and the touch driving electrodes are intersected and insulated. Wherein the multiple sub-pixels are directly opposite to the multiple stress buffering holes respectively, the conductive layer includes multiple conductive bodies disposed separately with the stress buffering holes, the conductive body is directly opposite to an interval region of the sub-pixels, when the touch driving electrodes are electrically connected, (Continued)

each two touch sensing electrodes are electrically connected through the conductive body, when the touch sensing electrodes are electrically connected, each two touch driving electrodes are electrically connected through the conductive body.

18 Claims, 5 Drawing Sheets

(51) Int. Cl.
*H01L 51/00* (2006.01)
*H01L 51/56* (2006.01)

(52) U.S. Cl.
CPC .... *H01L 51/56* (2013.01); *G06F 2203/04102* (2013.01); *G06F 2203/04103* (2013.01); *G06F 2203/04107* (2013.01); *H01L 2251/5338* (2013.01)

(58) Field of Classification Search
CPC ... H01L 27/323; H01L 51/0097; H01L 51/56; H01L 2251/5338
See application file for complete search history.

(56) References Cited

FOREIGN PATENT DOCUMENTS

| CN | 104199580 A | 12/2014 |
|----|-------------|---------|
| CN | 106952938 A | 7/2017  |

\* cited by examiner

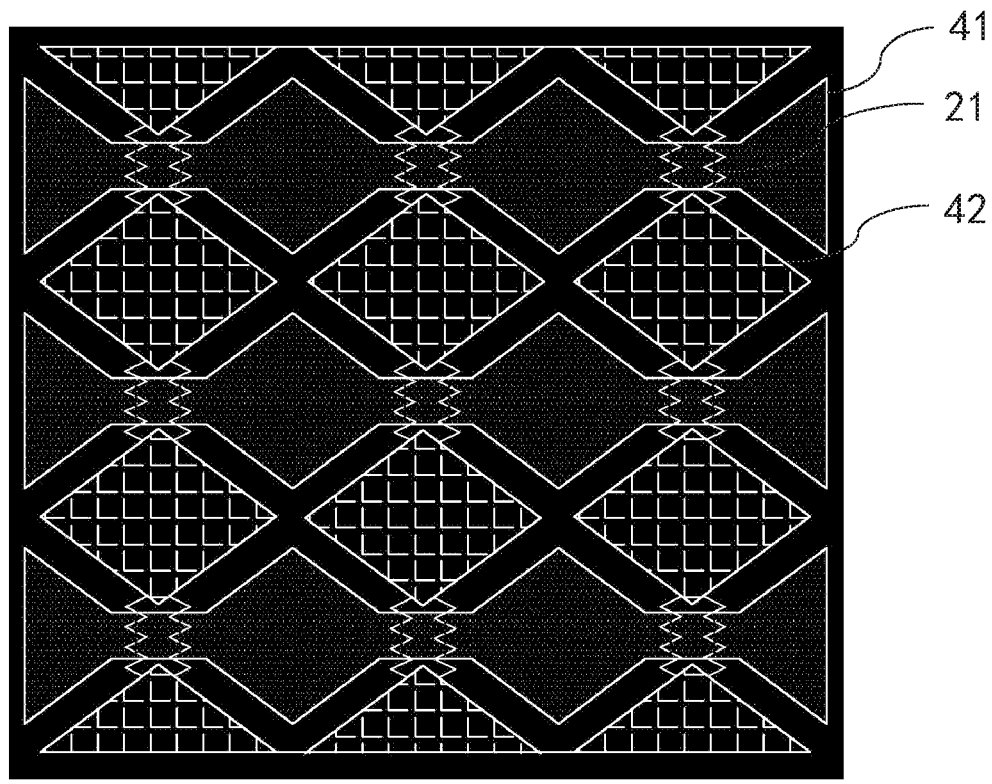

FIG. 4

| Sequentially forming a conductive layer and an insulation layer on the surface of the flexible display panel, wherein the flexible display panel includes multiple sub-pixels arranged as a matrix, and the conductive layer includes multiple conductive bodies disposed at intervals and are insulated, two ends of the conductive body penetrate a surface of the insulation layer, and the sub-pixels is directly opposite to the stress buffering holes | — S10 |

↓

| Forming multiple stress buffering holes in the insulation layer, the sub-pixels is directly opposite to the stress buffering holes | — S20 |

↓

| Forming a touch electrode layer on a surface of the insulation layer, wherein the touch electrode layer includes multiple touch sensing electrodes arranged as a matrix and multiple touch driving electrodes arranged as a matrix, the touch sensing electrodes and the touch driving electrodes are intersected and insulated, and each two touch driving electrodes are electrically connected, and each two touch sensing electrodes are electrically connected through the conductive body | — S30 |

FIG. 5

Forming multiple via holes disposed at an interval in the insulation layer, and two ends of the conductive body are disposed in the via holes — S21

FIG. 6

FLEXIBLE DISPLAY AND MANUFACTURING METHOD FOR THE SAME

CROSS-REFERENCE TO RELATED APPLICATION

This application is a National Phase of International Application Number PCT/CN2018/091512, filed Jun. 15, 2018, and claims the priority of Chinese Patent Application No. 201810299892.8, entitled "FLEXIBLE DISPLAY AND MANUFACTURING METHOD FOR THE SAME", filed on Apr. 4, 2018, the disclosure of which is incorporated herein by reference in its entirety.

FIELD OF THE INVENTION

The present invention relates to a flexible display technology field, and more particularly to a flexible display and manufacturing method for the same.

BACKGROUND OF THE INVENTION

Because the flexible display of the Organic Light-Emitting Diode (OLED) has many advantages such as light weight, small size, low power consumption and flexibility, the research of the flexible display has become a hot research topic in various universities and research institutions, especially mobile display products such as mobile phones, computers and watches. However, the conventional flexible display technology cannot manufacture a high-quality flexible display which is light and thin and flexible.

SUMMARY OF THE INVENTION

The purpose of the present application is to provide a flexible display and a manufacturing method thereof, which can realize a flexible display which is light, thin and flexible.

A flexible display, comprising: a flexible display panel; a conductive layer, an insulation layer, and a touch electrode layer which are sequentially stacked on a surface of the flexible display panel; wherein the flexible display panel includes multiple sub-pixels arranged as a matrix, the touch electrode layer includes multiple touch sensing electrodes arranged as a matrix and multiple touch driving electrodes arranged as a matrix, the touch sensing electrodes and the touch driving electrodes are intersected and insulated; wherein the insulation layer is provided with multiple stress buffering holes disposed at intervals, the multiple sub-pixels are directly opposite to the multiple stress buffering holes respectively, the conductive layer includes multiple conductive bodies disposed separately with the stress buffering holes, the conductive body is directly opposite to an interval region of the sub-pixels, when the touch driving electrodes are electrically connected in a same layer, each two touch sensing electrodes are electrically connected through the conductive body, when the touch sensing electrodes are electrically connected in a same layer, each two touch driving electrodes are electrically connected through the conductive body.

Wherein the conductive body is directly opposite to a middle location of the interval region of the sub-pixels.

Wherein a protective layer is disposed on the touch electrode layer, and the protective layer is filled in the stress buffering holes.

Wherein the insulation layer is provided with multiple via holes disposed at intervals, two ends of the conductive body are connected to the touch electrode layer through the via holes.

Wherein the via hole and the stress buffering hole are simultaneously formed.

Wherein the conductive body is a curved structure formed by a metal material or a transparent conductive material.

Wherein the touch sensing electrode is directly opposite to the interval region of the sub-pixels, and the touch driving electrode is directly opposite to the interval region of the sub-pixels.

Wherein the flexible display panel further provides a buffering layer, and the conductive layer is disposed at a surface of the buffering layer away from the flexible display panel.

A manufacturing method for a flexible display, comprising steps of: sequentially forming a conductive layer and an insulation layer on the surface of the flexible display panel, wherein the flexible display panel includes multiple sub-pixels arranged as a matrix, and the conductive layer includes multiple conductive bodies disposed at intervals and are insulated, two ends of the conductive body penetrate a surface of the insulation layer, and the conductive layer is directly opposite to an interval region of the sub-pixels; forming multiple stress buffering holes in the insulation layer, the sub-pixels is directly opposite to the stress buffering holes; and forming a touch electrode layer on a surface of the insulation layer, wherein the touch electrode layer includes multiple touch sensing electrodes arranged as a matrix and multiple touch driving electrodes arranged as a matrix, the touch sensing electrodes and the touch driving electrodes are intersected and insulated, and each two touch driving electrodes are electrically connected, and each two touch sensing electrodes are electrically connected through the conductive body.

Wherein, the conductive body is a metal material or a transparent conductive material.

Wherein the step of forming multiple stress buffering holes in the insulation layer, the sub-pixels is directly opposite to the stress buffering holes comprises a step of: forming multiple via holes disposed at an interval in the insulation layer, and two ends of the conductive body are disposed in the via holes.

In the present application, a conductive layer, an insulation layer, and a touch electrode layer are sequentially stacked on a surface of a flexible display panel, wherein the flexible display panel includes multiple sub-pixels arranged as a matrix to realize thinning and flexible touch of the flexible display. Further, a stress buffering hole is disposed in the insulation layer to reduce tensile stress or compressive stress of the touch electrode layer. In addition, the conductive layer includes multiple conductive bodies disposed at intervals. When the touch driving electrodes are electrically connected in the same layer, each two touch sensing electrodes are electrically connected through the conductive body; When the touch sensing electrodes are electrically connected to the same layer, each two touch driving electrodes are electrically connected through the conductive body. Therefore, the touch electrode layer is electrically connected through the conductive body to realize flexible touch of the flexible display.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

FIG. 4 is a schematic structural diagram of the touch electrode layer of FIG. 1.

FIG. 5 is a flow chart of manufacturing a flexible display according to an embodiment of the present application.

FIG. 6 is a partial flow chart of step S20 in FIG. 5.

DETAILED DESCRIPTION OF PREFERRED EMBODIMENTS

Figure 1:
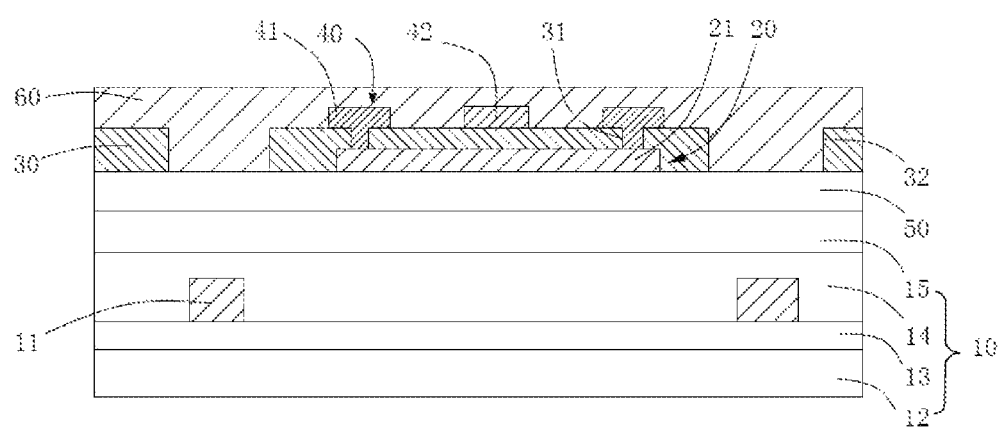
FIG. 1 is a schematic cross-sectional view of a flexible display according to an embodiment of the present application.

Referring to FIG. 1, an embodiment of the present application provides a flexible display. The flexible display includes a flexible display panel 10, and a conductive layer 20, an insulation layer 30, and a touch electrode layer 40 which are sequentially stacked on a surface of the flexible display panel 10. The flexible display panel 10 includes multiple sub-pixels 11 arranged as a matrix. The touch electrode layer 40 includes multiple touch sensing electrodes 41 arranged as a matrix and multiple touch driving electrodes 42 arranged as a matrix. The touch sensing electrodes 41 and the touch driving electrodes 42 are intersected and insulated from each other.

The insulation layer 30 is provided with multiple stress buffering holes 32 disposed at intervals, and the multiple sub-pixels 11 are directly opposite to the multiple stress buffering holes 32 respectively. The conductive layer 20 includes multiple conductive bodies 21 disposed separately with the stress buffering holes 32. The conductive body 21 is directly opposite to an interval region of the sub-pixels 11. When the touch driving electrodes 42 are electrically connected in a same layer, each two touch sensing electrodes 41 are electrically connected through the conductive body 21; when the touch sensing electrodes 41 are electrically connected in a same layer, each two touch driving electrodes 42 are electrically connected through the conductive body 21.

In this embodiment, a conductive layer 20 is disposed on the surface of the flexible display panel 10, and each two touch sensing electrodes 41 or each two touch driving electrodes 42 are electrically connected through the conductive body 21 in the conductive layer 20 in order to realize a lightweight and flexible touch of flexible display. Furthermore, the stress buffering holes 32 are provided in the insulation layer 30 to reduce tensile stress or compressive stress of the touch electrode layer 40. In addition, the flexible display is prepared by sequentially providing the conductive layer 20, the insulation layer 30 and the touch electrode layer 40 directly on the flexible display panel 10. Comparing with sticking a touch control layer on the surface of the flexible display panel 10, the manufacturing process of flexible display is reduced, thereby reducing the cost of materials and labor.

Specifically, the flexible display comprises a flexible display panel 10 and a conductive layer 20, an insulation layer 30 and a touch electrode layer 40 which are sequentially stacked on the surface of the flexible display panel 10. The flexible display panel 10 is used to implement a flexible display. The conductive layer 20, the insulation layer 30 and the touch electrode layer 40 are used to implement flexible touch sensing. Therefore, the flexible display can realize a flexible touch display. In this embodiment, the flexible display panel 10 includes a flexible substrate 12, an array substrate layer 13, an organic light-emitting layer 14, and an encapsulation layer 15 which are sequentially stacked. The array substrate layer 13 is used to drive the flexible display.

The organic light-emitting layer 14 includes multiple sub-pixels 11 arranged as a matrix, and an interval region is formed between each adjacent two sub-pixels 11. The conductive body 21 is directly opposite to the interval region between the adjacent two sub-pixels 11, so that when the organic light-emitting layer 14 emits light, the conductive body 21 can be prevented from blocking the light source to reduce an emitting brightness of the flexible display. The encapsulation layer 15 is used to protect the flexible display panel 10 from moisture, oxygen, dust and other external environments. In another embodiment, the flexible display panel 10 further includes a first buffering layer (not shown). The first buffering layer is disposed on the flexible substrate 12. The material of the first buffering layer may be, but not limited to, an inorganic material such as $SiO_2$ or SiNx. The material of the first buffering layer may be $SiO_2$ or SiNx disposed at an interval. The first buffering layer can be used to protect the array substrate layer 13 in the flexible display panel from entering of moisture or oxygen or the like.

As shown in FIG. 1, the flexible display panel 10 is further provided with a buffering layer 50, and the conductive layer 20 is laminated on the buffering layer 50. Specifically, using the flexible display panel 10 as a base, and forming the buffering layer 50 on a surface of the encapsulation layer 15 of the flexible display panel 10. The buffering layer 50 can protect the flexible display panel 10 from the influence of water vapor, oxygen, dust and other external environments, and the influence of the voltage signal of the touch electrode layer 40 on the electrical characteristics of the array substrate layer 13 of the flexible display panel 10. In this embodiment, the material of the buffering layer 50 may be an inorganic material such as $SiO_2$ or SiNx. Therefore, a buffering layer 50 of an inorganic material is deposited directly on the surface of the encapsulation layer 15 by a chemical vapor deposition method. The chemical vapor deposition method can make the buffering layer 50 tightly coupled with the flexible display panel 10, so that the flexible display can be made lighter and thinner comparing to the touch layer adhering to the flexible display panel 10 by an adhesive. In other embodiments, in order to make the flexible display more flexible, the material of the buffering layer 50 may also adopt an alternate structure of an organic material and an inorganic material. Specifically, it can be set according to actual conditions, and the present invention is not limited.

As shown in FIG. 1, the conductive layer 20 is laminated on the surface of the buffering layer 50. The conductive layer 20 includes multiple conductive bodies 21 disposed at an interval. Preferably, the conductive body 21 is directly opposite to a middle location of the interval region of the sub-pixels 11. In this way, it can be ensured that the conductive body 21 completely avoids the position where the sub-pixel 11 emits light, and does not affect the emitting effect of the flexible display. In this embodiment, the conductive body 21 made of a metal material that can realize the slimness of the flexible display. The material of the conductive body 21 may be a metal material such as titanium or aluminum. Due to the superior electrical conductivity of the conductive body 21 of the metal material, the flexible display has a sensitive response to touch. In other embodiments, the conductive body 21 may also be facing any location within the interval regions of the sub-pixels 11. In addition, the material of the conductive body 21 may also be an alloy material such as titanium/aluminum/titanium or other organic conductive material, and the organic conductive material is a transparent conductive film, thereby ensuring that the transparent conductive film does not block the emitting light of the sub-pixel 11 in order to enhance the brightness of the flexible display.

In this embodiment, an insulation layer 30 is provided on the surface of the conductive layer 20, and the insulation layer 30 covers the conductive body 21. The material of the insulation layer 30 is $SiO_2$ or SiNx, and the insulation layer 30 is a transparent film, so that the light emitted by the sub-pixel 11 can pass through the insulation layer 30. The insulation layer 30 can protect the flexible display panel 10 from moisture, oxygen, dust and other external environments, and can more effectively avoid influences of the electrical characteristics of the touch panel voltage signal to the array substrate layer 13 of the flexible display panel 10. In addition, through the cooperation of the insulation layer 30 and the conductive body 21, the electrical connection of each two touch driving electrodes 42 can be realized under the electrical connection of each two touch sensing electrodes 41, or realizing the electrical connection of each two touch sensing electrodes 41 under the electrical connection of each two touch driving electrodes 42. In other embodiments, the material of the insulation layer 30 may also be $SiO_2$ mixed with SiNx, and specifically, no limitation is imposed.

The insulation layer 30 is provided with multiple via holes 31 disposed at intervals. The two ends of the conductive body 21 are connected to the touch electrode layer 40 through the via holes 31. Specifically, the positions of the via holes 31 are provided at both ends of the conductive body 21. When the touch driving electrodes 42 are electrically connected to each other in a same layer, each two touch sensing electrodes 41 are electrically connected through the two ends of the conductive body 21 and passing through the via holes 31; when the touch sensing electrodes 41 are electrically connected in the same layer, each two touch driving electrodes 42 are electrically connected through two ends of the conductive body 21 passing through the via holes 31. In this embodiment, two ends of each conductive body 21 are provided with two via holes. Two via holes 31 can ensure that each two touch sensing electrodes 41 or each two touch driving electrodes 42 are electrically connected to avoid two touch sensing electrodes 41 or the two touch driving electrodes 42 being disconnected because one of the two via holes 31 is disconnected. In other embodiments, one or more than three via holes 31 may be respectively disposed at two ends of each conductive body 21, which are specifically set according to actual conditions.

The insulation layer 30 is provided with multiple stress buffering holes 32, and the sub-pixels 11 are directly opposite to the stress buffering hole. The stress buffering hole 32 is used to effectively reduce the stress of the flexible display when the flexible display is bent, avoid the breakage of the touch electrode layer 40, and also make the flexible display to be flexible, and avoid damage of the OLED layer. In this embodiment, the via hole 31 and the stress buffering hole 32 are simultaneously formed by an etching process. In this way, not only the implementation of the via hole 31 connecting each two touch sensing electrodes 41 or each two touch driving electrodes 42 but also reducing the stress of the flexible display and avoiding the breakage of the touch electrode layer 40. Furthermore, the formation of the stress buffering holes 32 does not add an additional process step.

Figure 2:
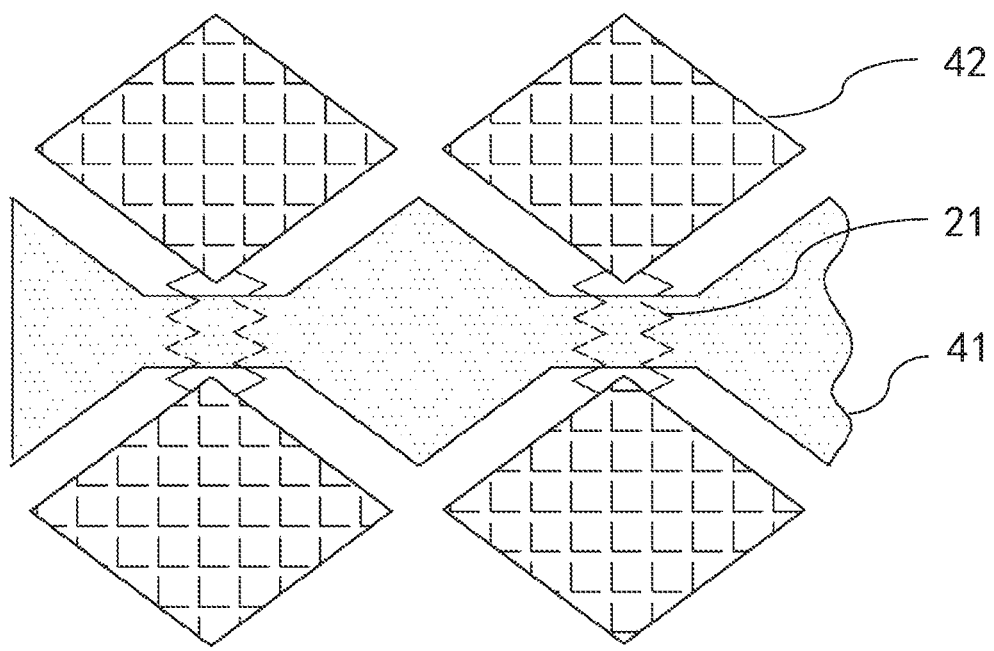
FIG. 2 is a schematic structural diagram of a first embodiment of the connection of each two touch driving electrodes of FIG. 1.

As shown in FIG. 2, the touch electrode layer 40 is formed on the surface of the insulation layer 30, and the touch sensing electrodes 41 of the same row are connected to form a sensing electrode chain, and the touch driving electrodes 42 of the same column are connected to form a driving electrode chain. The touch sensing electrode chain and the touch driving electrode chain are intersected and insulated. In this embodiment, the touch electrode layer 40 is an electrode trace formed by depositing a layer of conductive material on the insulation layer 30 and patterning. The touch electrode layer 40 after being patterned is a mesh structure. When the electrode traces are directly opposite to the interval region, the electrode traces can be prevented from blocking the emitted light of the sub-pixels 11, thereby increasing the brightness of the flexible display. In other embodiments, the touch electrode layer 40 can also be designed as a transparent thin film conductive material, so that the light emitted by the sub-pixel 11 can pass through the touch electrode layer 40 to ensure the brightness of the flexible display. The present invention can design according to the actual situation.

Specifically, the touch sensing electrode 41 is directly opposite to the interval region of the sub-pixels 11. The touch sensing electrode 41 has a mesh structure. Preferably, the mesh structure is a rhombic shape. The rhombic mesh structure is convenient for the staff to prepare, and since the sub-pixel 11 is generally not fixed in size, the rhombic mesh structure is more likely to be directly opposite to the interval region of the sub-pixel 11. Optionally, the mesh structure may be a square, a rectangle, or an irregular figure, which is not limited in the present invention. By aligning the touch driving electrode 42 to be directly opposite to the interval region of the sub-pixels 11, the touch sensing electrode 41 can completely avoid the position of the sub-pixel 11 of the organic light-emitting layer 14 so that the light emitted by the sub-pixel 11 is completely illuminated, thereby improving the light-emitting effect of the flexible display.

Specifically, the touch driving electrode 42 is directly opposite to the interval region of the sub-pixels 11. The touch driving electrode 42 has a mesh structure. Preferably, the mesh structure is a rhombic shape. The rhombic mesh structure is convenient for the staff to prepare, and since the sub-pixel 11 is generally not fixed in size, the rhombic mesh structure is more likely to be directly opposite to the interval region of the sub-pixel 11. Optionally, the mesh structure may be a square, a rectangle, or an irregular figure, which is not limited in the present invention. By aligning the touch driving electrode 42 to be directly opposite to the interval region of the sub-pixels 11, the touch driving electrode 42 can completely avoid the position of the sub-pixel 11 of the organic light-emitting layer 14 so that the light emitted by the sub-pixel 11 is completely illuminated, thereby improving the light-emitting effect of the flexible display.

In this embodiment, the structure of the touch electrode layer 40 is that the touch sensing electrode 41 and the touch driving electrode 42 are interested and insulated, and when each two touch sensing electrodes 41 are electrically connected, and each two touch driving are insulated and connected, each two touch driving electrodes 42 is electrically connected through the conductive body 21, and the conductive body 21 is directly opposite to the interval region of the sub-pixels 11. At this time, a certain pattern of the conductive body 21 needs to be formed. The conductive body 21 is a curved structure formed by a metal material or a transparent conductive material.

Figure 3:
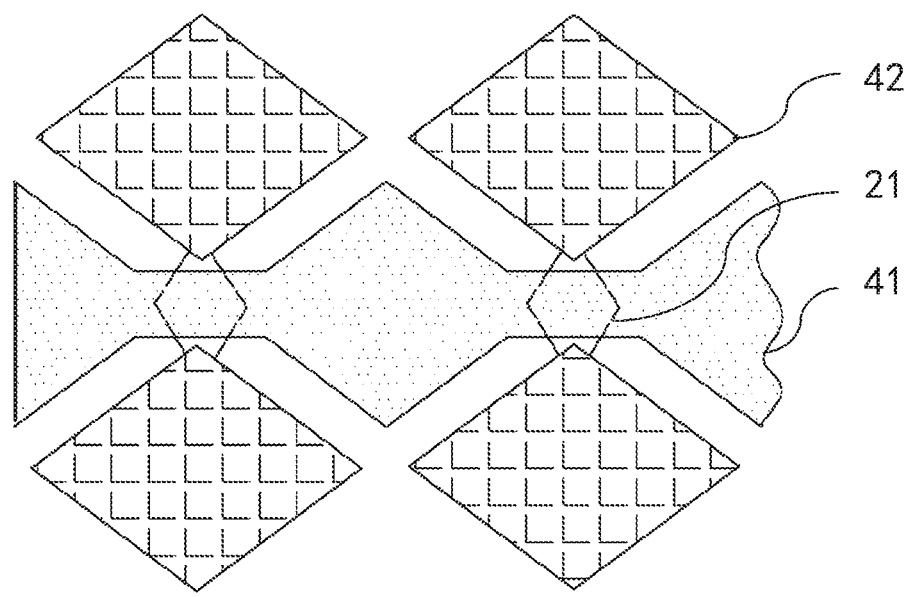
FIG. 3 is a schematic structural diagram of a second embodiment of the connection of each two touch driving electrodes of FIG. 1.

In the first embodiment of the present embodiment, as shown in FIG. 3, each conductive body 21 forms a strip-shaped conductive material that is bent repeatedly along the mesh path of the touch sensing electrodes 41. The number of bending is determined according to the number of grids of the touch sensing electrodes 41 existing in the region between each two touch driving electrodes 42. In this embodiment, each conductive body 21 is made of two strip-shaped conductive materials that are bent repeatedly, and the two strip-shaped conductive materials that are bent repeatedly are bent inward to form a receiving space. In this way, when one of the conductive bodies 21 is broken, the other conductive body 21 can still maintain an electrical connection. The conductive material is a metal material. In other embodiments, each conductive body 21 may be made of one or more strip-shaped conductive materials, which may also be organic conductive materials. The two bent conductive bodies 21 can also be bent outward, which is not limited in the present invention. The path of the structure of the conductive body 21 is the shortest, and it is obvious that the resistance of the conductive body 21 will be minimized, which can improve the sensitive touch response of the flexible display.

In the second embodiment of the present embodiment, as shown in FIG. 4, each conductive body 21 forms a strip-shaped conductive material bent once along the mesh path of the touch sensing electrodes 41. In the present embodiment, each conductive body 21 is made of two strip-shaped conductive materials that are bent once. In this way, when one of the conductive bodies 21 is broken, the other conductive body 21 can still maintain an electrical connection. The conductive material is a metal material. In other embodiments, each conductive body 21 may be made of one or more strip-shaped conductive materials, which may also be organic conductive materials, which is not limited in the present invention. Since the strip-shaped conductive material is bent only once, it is advantageous for the conductive body 21 to be less likely to be broken due to less bending points.

Optionally, each two touch driving electrodes 42 are electrically connected directly through a transparent organic conductive material. Since each of the conductive bodies 21 is a transparent organic conductive material, the sub-pixels 11 emit light through the conductive body 21 without affecting the light emission of the flexible display. In this embodiment, each conductive body 21 is made of two transparent organic conductive materials. In this way, when one of the conductive bodies 21 is broken, the other conductive body 21 can still maintain an electrical connection. In other embodiments, each of the conductive bodies 21 may be made of one or two or more strip-shaped conductive materials, which are not limited in the present invention. The conductive body 21 is simple in process and convenient for the staff to prepare.

As shown in FIG. 5, the touch sensing electrodes 41 of the same row are connected to form a sensing electrode chain, and the touch driving electrodes 42 of the same column are connected to form a driving electrode chain, and the touch sensing electrode chain and the touch driving electrode chain are intersected and insulated. The multiple sensing electrode chains extend in a first direction and are spaced apart in a second direction, and the multiple driving electrode chains extend along the second direction and are spaced apart along the first direction.

In this embodiment, the touch sensing electrodes 41 on the same sensing electrode chain are electrically connected to each other, and the touch driving electrodes 42 of the same driving electrode chain are connected through the conductive body 21. In other embodiments, the touch driving electrodes 42 on the same driving electrode chain are electrically connected to each other, and the touch sensing electrodes 41 of the same sensing electrode chain are connected through the conductive body 21.

Wherein, the meaning of "extension" means extending and stretching outward in the width, size, and range. In this embodiment, it is meant that the sensing electrode chain is elongated outward in the first direction, and the driving electrode chain is elongated outward in the second direction.

As shown in FIG. 1, a protective layer 60 is disposed on the touch electrode layer 40, and the protective layer is filled in the stress buffering holes 32. Specifically, a protective layer 60 is formed on the surface of the touch electrode layer 40, and the protective layer 60 covers the touch electrode layer 40 and the stress buffering hole 32. The protective layer 60 serves to protect the flexible display panel 10 from moisture, oxygen, dust, and other external environments. The material of the protective layer 60 is a transparent organic material. In this embodiment, the polymer solution is a polyimide solution. In other embodiments, other polymer solutions such as polyethylene or polyethylene terephthalate may also be employed. The polymer solution has a high temperature tolerance.

The polymer solution covers the touch electrode layer 40, so that the touch electrode layer 40 has flexibility, thereby achieving flexible touch sensing of the flexible display. When the flexible display is bent, the stress applied to the touch electrode layer 40 is small, so that the touch electrode layer 40 is not easily to be damaged or broken. Furthermore, the polymer solution fills the stress buffering holes 32 on the surface of the insulation layer and solidifies. Since the stress buffering hole 32 is filled with the organic material, the flexible display further reduces the stress it is subjected to when the flexible display is bent, so that the flexible display can be further prevented from being damaged or broken.

In this embodiment, a conductive layer 20 is disposed on the surface of the flexible display panel 10, and each two touch sensing electrodes 41 or each two touch driving electrodes 42 is electrically connected through the conductive body 21 in the conductive layer 20 in order to achieve the lightweight and flexible touch of flexible display. Furthermore, a stress buffering hole 32 is provided in the insulation layer 30 to reduce tensile stress or compressive stress of the touch electrode layer 40. In addition, the flexible display is prepared by sequentially providing the conductive layer 20, the insulation layer 30 and the touch electrode layer 40 directly on the flexible display panel 10. Comparing with sticking the touch layer on the surface of the flexible display panel 10, the manufacturing process of the flexible display is reduced, thereby reducing the cost of materials and labor.

Referring to FIG. 6, the present application further provides a manufacturing method for a flexible display, which is used to prepare the flexible display described above, and includes:

In step S10, sequentially forming a conductive layer 20 and an insulation layer 30 on the surface of the flexible display panel 10. The flexible display panel 10 includes multiple sub-pixels 11 arranged as a matrix, and the conductive layer 20 includes multiple conductive bodies 21 disposed at intervals and are insulated, two ends of the conductive body 21 penetrate a surface of the insulation layer 30, and the conductive layer 20 is directly opposite to an interval region of the sub-pixels 11;

In this embodiment, the conductive layer 20 is a metal material or a transparent conductive material. The material of the conductive body 21 may be a metal material such as titanium or aluminum. In this process, the conductive body 21 is an aluminum film. Specifically, depositing a first aluminum layer on the surface of the flexible display panel 10 through a physical vapor deposition method, and the physical vapor deposition method is a magnetron sputtering method. The surface of the first aluminum layer is even and uniform, and the roughness is on the order of nanometers. Since the conductive body 21 faces the interval region of the sub-pixel 11, the conductive body 21 is a bent strip-shaped aluminum film.

In order to form a bent strip of aluminum film, spin coating a layer of photoresist on the surface of the flat aluminum film, and exposing under the action of a patterned mask. The photoresist irradiated by the light is cleaned by a developer, and the shape of the unwashed photoresist is the same as the bent strip-shaped aluminum film. The bent strip-shaped conductive body 21 is etched on the aluminum film by a plasma etching method. In other embodiments, the material of the conductive body 21 may also be an alloy material such as titanium/aluminum/titanium or other organic conductive materials. The first aluminum layer may also be subjected to a deposition process such as thermal evaporation.

Furthermore, forming an insulation layer 30 on the surface of the conductive body 21 by chemical vapor deposition, and the ends of the conductive body 21 are penetrated through the surface of the insulating layer 30 by a process such as deposition and etching. The material of the insulation layer 30 may be an inorganic material such as $SiO_2$ or SiNx. The insulation layer 30 can protect the flexible display panel 10 from moisture, oxygen, dust and other external environments, and can also avoid the influence of the voltage signal of the touch electrode layer 40 on the electrical characteristics of the array substrate layer 13 of the flexible display panel 10. In addition, since the touch sensing electrodes 41 and the touch driving electrodes 42 are intersected and insulated, each of the two touch sensing electrodes 41 can be electrically connected to each other through the cooperation of the insulation layer 30 and the conductive body 21, and the electrical connection of the touch driving electrodes 42 can be realized. When each two touch driving electrodes 42 are electrically connected, the electrical connection of each of the two touch sensing electrodes 41 can be achieved by the cooperation of the insulation layer 30 and the conductive body 21

Step S20, forming multiple stress buffering holes 32 in the insulation layer 30, the sub-pixels 11 is directly opposite to the stress buffering holes 32;

In order to form multiple stress buffering holes 32 on the surface of the insulation layer 30, in the present embodiment, a photoresist is formed on the surface of the insulation layer 30. A patterned mask is attached to the surface of the photoresist. The surface of the photoresist is then exposed. The photoresist irradiated by the light source is removed by cleaning with a developer. The multiple stress buffering holes 32 are formed by plasma etching. The sub-pixel 11 is right opposite to the stress buffering hole 32. By forming the stress buffering hole 32 on the surface of the insulation layer 30, when the flexible display is bent, the stress of the flexible display can be effectively reduced, the breakage of the touch electrode layer 40 can be avoided, and the flexible display can be made flexible to avoid damage to the OLED layer.

In the step S20, multiple stress buffering holes 32 are formed in the insulation layer 30, and the sub-pixels 11 are directly opposite to the stress buffering holes 32. The method further includes:

Step S21: forming multiple via holes 31 disposed at an interval in the insulation layer 30, and two ends of the conductive body 21 are disposed in the via holes 31.

Specifically, the via hole 31 and the stress buffering hole 32 are simultaneously formed by an etching process. In this way, not only the implementation of using the via hole 31 to connect each two touch sensing electrodes 41 or each two touch driving electrodes 42 can be realized but also reducing the stress of the flexible display and avoiding the breakage of the touch electrode layer 40. Furthermore, the formation of via holes 31 does not add an additional process step.

In the step S30, forming a touch electrode layer 40 on a surface of the insulation layer 30. The touch electrode layer 40 includes multiple touch sensing electrodes 41 arranged as a matrix and multiple touch driving electrodes 42 arranged as a matrix. The touch sensing electrodes 41 and the touch driving electrodes 42 are intersected and insulated, and each two touch driving electrodes 42 are electrically connected, and each two touch sensing electrodes 41 are electrically connected through the conductive body 21.

Specifically, forming a second metal layer on the surface of the insulation layer 30 through a physical vapor deposition. The material of the metal layer may be a metal material such as titanium or aluminum, or an alloy material such as titanium/aluminum/titanium. In this embodiment, a photoresist is formed on the surface of the second metal layer, and the patterned mask is attached to the surface of the photoresist, exposing, and cleaning by the developer to remove the light irradiated by a light source. The touch electrode layer 40 is formed by etching using a plasma etching method. The touch electrode layer 40 includes multiple touch sensing electrodes 41 arranged as a matrix and multiple touch driving electrodes 42 arranged as a matrix. The touch sensing electrode 41 and the touch driving electrode 42 are intersected and insulated. In this embodiment, each two touch sensing electrodes 41 of the touch electrode layer 40 is electrically connected, and each two touch driving electrodes 42 is insulated and connected. In other embodiments, each two touch driving electrodes 42 of the touch electrode layer 40 is electrically connected, and each two touch sensing electrodes 41 is insulated and connected.

In this embodiment, a conductive layer 20 is formed on the surface of the flexible display panel 10, and each two touch driving electrodes 42 is electrically connected through the conductive body 21 in the conductive layer 20 to prepare a flexible display. The flexible display can achieve both thin and light touch and flexible touch, and can also reduce the preparation process of the flexible display, thereby reducing the cost of materials and labor. Further, a stress buffering hole 32 is formed in the insulation layer 30 to reduce tensile stress or compressive stress of the touch electrode layer 40.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A flexible display, comprising: a flexible display panel; a conductive layer, an insulation layer, and a touch electrode layer which are sequentially stacked on a surface of the flexible display panel; wherein the flexible display panel includes multiple sub-pixels arranged as a matrix, the touch electrode layer includes multiple touch sensing electrodes arranged as a matrix and multiple touch driving electrodes arranged as a matrix, the touch sensing electrodes and the touch driving electrodes are intersected and insulated; wherein the insulation layer is provided with multiple stress buffering holes disposed at intervals, the multiple sub-pixels are directly opposite to the multiple stress buffering holes respectively, the conductive layer includes multiple conductive bodies disposed separately with the stress buffering holes, the conductive body is directly opposite to an interval region of the sub-pixels, when the touch driving electrodes are electrically connected in a same layer, each two touch sensing electrodes are electrically connected through the conductive body, when the touch sensing electrodes are electrically connected in a same layer, each two touch driving electrodes are electrically connected through the conductive body;

wherein the insulation layer is arranged to cover the multiple conductive bodies and each of the multiple conductive bodies is covered by a portion of the insulation layer that is formed with a group of multiple via holes including at least one first via hole and at least one second via hole, the touch electrode layer being formed on the insulation layer, the touch sensing electrodes or the touch driving electrodes being connected to the conductive body through the group of multiple via holes, wherein a part of the portion of the insulation layer intervenes between the first via hole and the second via hole to cover a part of the conductive body between the first via hole and the second via hole, and wherein the groups of via holes and the stress buffering holes are both formed in the insulation layer and are alternate with each other, such that the first and second via holes, respectively disposed at each end of the conductive body, are located in a space between two adjacent ones of the stress buffering holes and are also located in a space between two adjacent ones of the multiple sub-pixels.

2. The flexible display according to claim 1, wherein the conductive body is directly opposite to a middle location of the interval region of the sub-pixels.

3. The flexible display according to claim 1, wherein a protective layer is disposed on the touch electrode layer, and the protective layer is filled in the stress buffering holes.

4. The flexible display according to claim 1, wherein two ends of the conductive body are connected to the touch electrode layer through the via holes.

5. The flexible display according to claim 1, wherein the via holes and the stress buffering holes are simultaneously formed in the insulation layer.

6. The flexible display according to claim 1, wherein the conductive body is a curved structure formed by a metal material or a transparent conductive material.

7. The flexible display according to claim 1, wherein the touch sensing electrode is directly opposite to the interval region of the sub-pixels, and the touch driving electrode is directly opposite to the interval region of the sub-pixels.

8. The flexible display according to claim 2, wherein the touch sensing electrode is directly opposite to the interval region of the sub-pixels, and the touch driving electrode is directly opposite to the interval region of the sub-pixels.

9. The flexible display according to claim 3, wherein the touch sensing electrode is directly opposite to the interval region of the sub-pixels, and the touch driving electrode is directly opposite to the interval region of the sub-pixels.

10. The flexible display according to claim 4, wherein the touch sensing electrode is directly opposite to the interval region of the sub-pixels, and the touch driving electrode is directly opposite to the interval region of the sub-pixels.

11. The flexible display according to claim 5, wherein the touch sensing electrode is directly opposite to the interval region of the sub-pixels, and the touch driving electrode is directly opposite to the interval region of the sub-pixels.

12. The flexible display according to claim 6, wherein the touch sensing electrode is directly opposite to the interval region of the sub-pixels, and the touch driving electrode is directly opposite to the interval region of the sub-pixels.

13. The flexible display according to claim 7, wherein the flexible display panel further provides a buffering layer, and the conductive layer is disposed at a surface of the buffering layer away from the flexible display panel.

14. The flexible display according to claim 9, wherein the flexible display panel further provides a buffering layer, and the conductive layer is disposed at a surface of the buffering layer away from the flexible display panel.

15. The flexible display according to claim 10, wherein the flexible display panel further provides a buffering layer, and the conductive layer is disposed at a surface of the buffering layer away from the flexible display panel.

16. The flexible display according to claim 11, wherein the flexible display panel further provides a buffering layer, and the conductive layer is disposed at a surface of the buffering layer away from the flexible display panel.

17. The flexible display according to claim 12, wherein the flexible display panel further provides a buffering layer, and the conductive layer is disposed at a surface of the buffering layer away from the flexible display panel.

18. A manufacturing method for a flexible display, comprising steps of: sequentially forming a conductive layer and an insulation layer on the surface of the flexible display panel, wherein the flexible display panel includes multiple sub-pixels arranged as a matrix, and the conductive layer includes multiple conductive bodies disposed at intervals and are insulated, two ends of the conductive body penetrate a surface of the insulation layer, and the conductive layer is directly opposite to an interval region of the sub-pixels;

forming multiple stress buffering holes and multiple via holes in the insulation layer, wherein the sub-pixels are directly opposite to the stress buffering holes; and forming a touch electrode layer on a surface of the insulation layer, wherein the touch electrode layer includes multiple touch sensing electrodes arranged as a matrix and multiple touch driving electrodes arranged as a matrix, the touch sensing electrodes and the touch driving electrodes are intersected and insulated, and each two touch driving electrodes are electrically connected through the conductive body, and each two touch sensing electrodes are electrically connected through the conductive body, wherein the insulation layer is arranged to cover the multiple conductive bodies and each of the multiple conductive bodies is covered by a portion of the insulation layer that is formed with a group of multiple via holes including at least one first via hole and at least one second via hole, the touch electrode layer being formed on the insulation layer, the touch sensing electrodes or the touch driving electrodes being connected to the conductive body through the group of multiple via holes, wherein a part of the portion of the insulation layer intervenes between the first via hole and the second via hole to cover a part of the conductive body between the first via hole and the second via hole, and wherein the groups of via holes and the stress buffering holes are both formed in the insulation layer and are alternate with each other, such that the first and second via holes, respectively disposed at each end of the conductive body, are located in a space between two adjacent ones of the stress buffering holes and are also located in a space between two adjacent ones of the multiple sub-pixels.

\* \* \* \* \*